US012702045B2

(12) United States Patent
Tian et al.

(10) Patent No.: US 12,702,045 B2
(45) Date of Patent: Aug. 4, 2026

(54) PACKAGE STRUCTURE AND METHOD FOR MANUFACTURING SAME, SEMICONDUCTOR DEVICE

(71) Applicant: CHANGXIN MEMORY TECHNOLOGIES, INC., Hefei City (CN)

(72) Inventors: Kai Tian, Hefei (CN); Liang Chen, Hefei (CN); Mingxing Zuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 506 days.

(21) Appl. No.: 17/939,045

(22) Filed: Sep. 7, 2022

(65) Prior Publication Data

US 2023/0005851 A1     Jan. 5, 2023

Related U.S. Application Data

(63) Continuation of application No. PCT/CN2022/098442, filed on Jun. 3, 2022.

(30) Foreign Application Priority Data

Jun. 1, 2022    (CN) .......................... 202210621334.5

(51) Int. Cl.
*H10W 72/90* (2026.01)
*H10W 70/05* (2026.01)
(Continued)

(52) U.S. Cl.
CPC ......... *H10W 72/90* (2026.01); *H10W 72/019* (2026.01); *H10W 70/05* (2026.01);
(Continued)

(58) Field of Classification Search
CPC ..................... H01L 2224/05553–05624; H01L 2224/06515; H01L 2224/0239; H01L 2224/0231; H01L 24/03; H01L 24/05
See application file for complete search history.

(56) References Cited

U.S. PATENT DOCUMENTS

| | | | |
|---|---|---|---|
| 6,429,532 B1 | 8/2002 | Han | |
| 2006/0186405 A1* | 8/2006 | Tanabe | H10P 74/273 257/E23.179 |

(Continued)

FOREIGN PATENT DOCUMENTS

| | | |
|---|---|---|
| CN | 1819168 A | 8/2006 |
| CN | 101821634 A | 9/2010 |

(Continued)

OTHER PUBLICATIONS

First Office Action of the Taiwanese application No. 111139671, issued on Oct. 24, 2023, 7 pages with English abstract.

(Continued)

*Primary Examiner* — Khaja Ahmad
(74) *Attorney, Agent, or Firm* — Intellectual Valley Law, P.C.

(57) ABSTRACT

A packaging structure, a method for manufacturing the same and a semiconductor device are provided. The packaging structure includes a redistribution layer electrically connected with an interconnection layer of a semiconductor functional structure, and an insulating layer covering and exposing part of the redistribution layer. The exposed part of the redistribution layer includes at least one first pad. The first pad includes a first area and a second area arranged continuously. The first area is configured for testing. The second area is configured for performing functional interaction corresponding to content of the test.

13 Claims, 12 Drawing Sheets

(51) Int. Cl.
  *H10W 70/652* (2026.01)
  *H10W 70/66* (2026.01)
  *H10W 72/00* (2026.01)
(52) U.S. Cl.
  CPC .......... *H10W 70/652* (2026.01); *H10W 70/66* (2026.01); *H10W 72/01961* (2026.01); *H10W 72/932* (2026.01); *H10W 72/942* (2026.01); *H10W 72/952* (2026.01); *H10W 72/967* (2026.01)

(56) References Cited

U.S. PATENT DOCUMENTS

| | | | |
|---|---|---|---|
| 2006/0279001 A1 | 12/2006 | Nishida | |
| 2008/0083992 A1* | 4/2008 | Lin | H01L 24/48 257/774 |
| 2009/0045827 A1 | 2/2009 | Gangoso | |
| 2009/0134523 A1 | 5/2009 | Yamazaki | |
| 2009/0243118 A1 | 10/2009 | Akiba | |
| 2010/0283156 A1 | 11/2010 | Komatsu | |
| 2012/0077310 A1 | 3/2012 | Akiba | |
| 2013/0193438 A1 | 8/2013 | Akiba et al. | |
| 2013/0307119 A1* | 11/2013 | Chen | H01L 23/49822 257/532 |
| 2014/0353819 A1* | 12/2014 | Chuang | H01L 24/17 257/737 |
| 2014/0361299 A1 | 12/2014 | Akiba et al. | |
| 2016/0035636 A1 | 2/2016 | Akiba et al. | |
| 2016/0336244 A1* | 11/2016 | Akiba | H10P 74/273 |
| 2017/0062367 A1 | 3/2017 | Jo et al. | |
| 2017/0133333 A1* | 5/2017 | Kim | H01L 24/05 |
| 2017/0229359 A1 | 8/2017 | Akiba et al. | |
| 2017/0345726 A1* | 11/2017 | Huang | H10P 74/207 |
| 2018/0145001 A1 | 5/2018 | Akiba et al. | |
| 2018/0190579 A1* | 7/2018 | Chou | H01L 22/32 |
| 2018/0197832 A1 | 7/2018 | Kim et al. | |
| 2018/0275169 A1 | 9/2018 | Jacobs | |
| 2018/0356444 A1 | 12/2018 | Ganapol et al. | |
| 2019/0057756 A1 | 2/2019 | Kim et al. | |
| 2019/0057913 A1 | 2/2019 | Akiba et al. | |
| 2019/0252332 A1 | 8/2019 | Kim et al. | |
| 2019/0348332 A1 | 11/2019 | Akiba et al. | |
| 2020/0265913 A1 | 8/2020 | Kim et al. | |
| 2022/0013479 A1 | 1/2022 | Hseih | |
| 2022/0059417 A1* | 2/2022 | Park | H01L 22/32 |
| 2022/0352103 A1 | 11/2022 | Chen et al. | |

FOREIGN PATENT DOCUMENTS

| | | |
|---|---|---|
| CN | 103344791 A | 10/2013 |
| CN | 106684063 A | 5/2017 |
| CN | 108630562 A | 10/2018 |
| CN | 110120357 A | 8/2019 |
| CN | 111244057 A | 6/2020 |
| CN | 111554690 A | 8/2020 |
| CN | 112782561 A | 5/2021 |
| CN | 113284873 A | 8/2021 |
| CN | 113889414 A | 1/2022 |
| KR | 20170017510 A | 2/2017 |
| TW | 201830600 A | 8/2018 |

OTHER PUBLICATIONS

European Patent Office, Extended European Search Report Issued in Application No. 22899621.1, Jul. 31, 2024, Germany, 10 pages.

* cited by examiner

PACKAGE STRUCTURE AND METHOD FOR MANUFACTURING SAME, SEMICONDUCTOR DEVICE

CROSS-REFERENCE TO RELATED APPLICATIONS

The application is a continuation application of International Application No. PCT/CN2022/098442, filed on Jun. 13, 2022, which claims priority to Chinese Patent Application No. 202210621334.5, filed on Jun. 1, 2022 and entitled "PACKAGE STRUCTURE AND METHOD FOR MANU-FACTURING SAME, SEMICONDUCTOR DEVICE". The disclosures of International Application No. PCT/CN2022/098442 and Chinese Patent Application No. 202210621334.5 are hereby incorporated by reference in their entireties.

BACKGROUND

With the rapid increase of the popularity of electronic equipment and the vigorous development of the electronic equipment market, it is increasingly required that electronic products should be miniaturized and thinned while having high performance, multifunction, high reliability and convenience. The demand requires better, lighter, thinner, higher packaging density, better electrical and thermal properties, higher reliability and higher cost performance for the packaging of semiconductor devices.

In order to ensure the performance of semiconductor devices to meet the corresponding requirements, it is necessary to prepare ports on the package structure for testing and performing functional interaction.

SUMMARY

The disclosure relates to the technical field of semiconductors, and relates to, but is not limited to a package structure, a method for manufacturing the same and a semiconductor device.

Embodiments of the disclosure provide a package structure, a manufacturing method thereof, and a semiconductor device.

According to an embodiment of the disclosure, a package structure is provided, and the package structure includes a redistribution layer and an insulating layer.

The redistribution layer is electrically connected with an interconnection layer of a semiconductor functional structure.

The insulating layer covers the redistribution layer and exposes part of the redistribution layer.

Exposed part of the redistribution layer includes at least one first pad. The first pad includes a first area and a second area arranged continuously. The first area is configured to perform a test, and the second area is configured to perform functional interactions corresponding to content of the test.

According to embodiments of the disclosure, a semiconductor device is further provided, including a semiconductor functional structure and a package structure as described in any one of multiple embodiments of the disclosure.

According to the embodiments of the disclosure, a method for manufacturing a package structure is provided, which includes the following operations.

A redistribution layer is formed on a semiconductor functional structure, and the redistribution layer is electrically connected with an interconnection layer on the semiconductor functional structure.

An insulating layer is formed on a surface of the redistribution layer.

At least one first pad is formed, by removing part of the insulating layer to expose a portion of the redistribution layer. Each first pad is composed of part of the redistribution layer exposed by the insulating layer.

The first pad includes a first area and a second area arranged continuously. The first area is configured to perform a test, and the second area is configured to perform functional interaction corresponding to content of the test.

Figure 1:
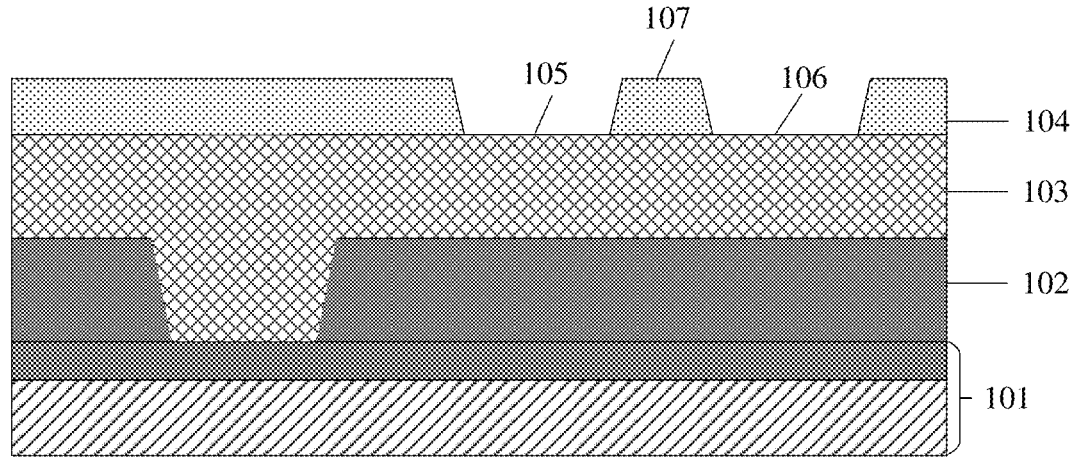
FIG. 1 is a schematic cross-sectional structural diagram of a package structure provided in an embodiment of the disclosure.

In the above drawings (which are not necessarily drawn to scale), similar reference numerals may describe similar components in different views. Similar reference numerals with different letter suffixes may represent different examples of similar components. The various embodiments discussed herein are generally shown in the drawings by way of example, but not limitation.

DETAILED DESCRIPTION

The technical solution of the disclosure will be further explained in detail below with reference to the drawings and embodiments. Although exemplary embodiments of the disclosure are shown in the drawings, it is to be understood that the disclosure may be embodied in various forms and should not be limited by the embodiments set forth herein. On the contrary, these embodiments are provided to enable a more thorough understanding of the disclosure and to fully convey the scope of the disclosure to those skilled in the art.

The embodiments of the disclosure are described in more detail by way of example in the following paragraphs with reference to the drawings. The advantages and features of the disclosure will become clearer from the following description and claims. It is to be noted that the drawings are in a very simplified form with inaccurate proportions, and the drawings are only used to facilitate and clearly assist in illustrating the purposes of the embodiments of the disclosure.

It is understood that the meanings of "on", "up" and "above" of the disclosure should be interpreted in the widest manner, so that "on" not only means its meaning of "on" something "without intervening features or layers (that is, directly on something), but also includes" on "something with intervening features or layers.

In the embodiments of the disclosure, the term "A connected to B" includes a case where both A and B are in direct contact, or another case where A and B are in indirect contact through an intermediate conductive structure.

In the embodiments of the disclosure, the terms "first", "second" and the like are used to distinguish similar objects and need not be used to describe a particular order or priority.

In the embodiments of this disclosure, the term "layer" refers to a material part that includes a region having a thickness. The layer may extend on a lower surface or an upper surface of the structure, and its area may be less than or equal to the extended surface on which it lies.

It is to be noted that the technical solution described in the embodiments of this disclosure can be arbitrarily combined without conflict.

The semiconductor functional structure related in embodiments of the disclosure is the one which will be used in subsequent processes to form at least a part of final device structure. Here, the final device may include a memory.

In a design of a package structure of a semiconductor device such as dynamic random access memory (DRAM), a design mode of pads (also called bonding pad, expressed as PAD in English) is windowing the redistribution layer (RDL).

Windowing the redistribution layer means that a redistribution layer is formed on a top metal layer of a semiconductor functional structure, a passivation layer or an insulating layer is formed on the redistribution layer, and then windowing areas are formed on the passivation layer or the insulating layer to expose part of the redistribution layer and form two types of pads arranged side by side. Here, the redistribution layer can play a role in adjusting positions of the pads in the semiconductor device, and can also play a role of strengthening power supply network of power ground.

In a mode of windowing the redistribution layer, two types of pads are usually provided, namely first type of pad and second type of pad. The first type of pad is used for probe card sticking test of probe card, and the second type of pad is used for leading out bonding wire on the pad. Due to need of physical isolation, and considering limited identification area of a machine for the first type of pad and the second type of pad, a partition wall is generally provided between a first type of pad and a second type of pad arranged side by side, as shown in FIG. 1.

For example, referring to FIG. 1, an isolation layer 102, a redistribution layer 103 covering the isolation layer 102, and an insulating layer 104 covering the redistribution layer 103 are stacked in sequence on a semiconductor functional structure 101. After part of the insulating layer 104 is removed, part of the redistribution layer 103 is exposed. The exposed part of the redistribution layer 103 includes a first type of pad 105 and a second type of pad 106. A partition wall 107 is provided between the first type of pad 105 and the second type of pad 106.

However, during alignment of a probe card with the first type of pad, when the probe card deviates from the center point of the first type of pad, probes of the probe card may hit the sidewall directly. Higher height of the sidewall will increase damage probability of the probe card. At the same time, the sidewalls are also easy to contaminate the probes with impurities (such as dielectric materials), thereby affecting test results. In addition, after the probe card breaks the partition wall, performance of the second type of pad 106 may also be affected, thereby affecting operation of the semiconductor functional structure.

In view of this, in order to solve one or more of the above problems, the embodiments of the disclosure provide a package structure, a manufacturing method thereof and a semiconductor device. The package structure includes a redistribution layer and an insulating layer. The redistribution layer is electrically connected with an interconnection layer of a semiconductor functional structure. The insulating layer covers and exposes part of the redistribution layer. The exposed part of the redistribution layer includes at least one first pad. The first pad includes a first area and a second area arranged continuously. The first area is configured to perform a test, and the second area is configured to perform functional interaction corresponding to content of the test.

Figure 2A:
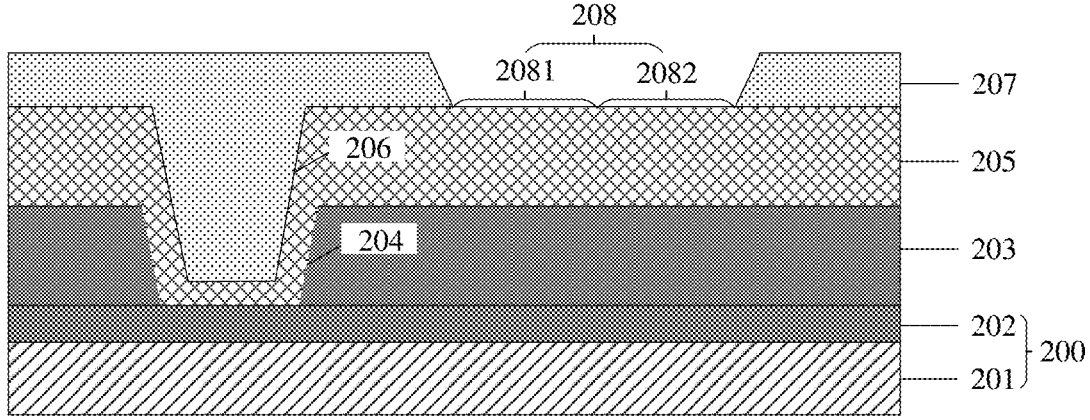
FIG. 2A is a schematic cross-sectional structural diagram of another package structure provided in an embodiment of the disclosure.

Specifically, referring to FIG. 2A, the package structure includes a substrate (not shown in FIG. 2A), a semiconductor functional structure 200, an isolation layer 203 and redistribution layer 205.

A component material of the substrate may include silicon (Si), germanium (Ge), silicon germanium (SiGe), silicon on insulator (SOI), or germanium on insulator (GOI).

The semiconductor functional structure 200 is located above the substrate. Specifically, the semiconductor functional structure 200 includes a semiconductor functional layer 201 and an interconnection layer 202 located on the semiconductor functional layer 201. In the semiconductor functional layer 201, multiple functional structures may be provided according to actual requirements. Accordingly the interconnection layer 202 is configured for leading out the electrical signal of the functional structure in the semiconductor functional layer 201, to operate the functional structures. In some embodiments, the interconnection layer 202 includes a top metal layer, and the top metal layer is configured for not only leading out the electrical signal of the functional structure but also supporting the semiconductor functional structure 200.

The isolation layer 203 covers the surface of the interconnection layer 202, and is configured for isolating the interconnection layer 202 from the subsequently formed redistribution layer 205 in part area. A via 204 is provided in the isolation layer 203, and the via 204 exposes part of the interconnection layer 202. The shape of the via 204 may be cylindrical or inverted trapezoidal or any suitable shape. The component material of the isolation layer 203 includes but is not limited to tetraethyl orthosilicate (TEOS).

The redistribution layer 205 covers the surface of the isolation layer 203 and the sidewall and the bottom of the via 204. Part of the redistribution layer 205 is connected to the exposed part of the interconnection layer 202 for leading out an electrical signal of the interconnection layer 202. The component material of the redistribution layer 205 includes but is not limited to metal. Preferably, the material of the redistribution layer is aluminum (Al).

It is to be noted that, the thickness of the redistribution layer 205 on the exposed part of the interconnection layer 202 may be the same as the thickness of the redistribution layer 205 on the surface of the isolation layer 203. In some embodiments, the diameter width of the via 204 is larger than twice the thickness of the redistribution layer 205, at this time, the redistribution layer 205 covers the sidewall and bottom of the via 204, and defines a groove 206. An insulating layer 207, which covers the surface of the redistribution layer 205, may be configured for isolating electrical connections between the redistribution layer 205 and other conductive materials on the one hand, and may be configured for protecting the redistribution layer 205 from being damaged on the other hand. The material of the insulating layer 207 includes but is not limited to polyimide (PI).

The insulating layer 207 also filled the groove 206.

In some embodiments, the hardness of the material of the insulating layer 207 is smaller than the hardness of the material of the redistribution layer 205, so that the stress of the package structure can be reduced and reliability of the package structure can be increased.

Part of the insulating layer 207 is removed and the exposed part of the redistribution layer 205 includes a first pad 208. The first pad 208 includes a first area 2081 and a second area 2082 arranged continuously. The first area 2081 is configured to perform a test, and the second area 2082 is configured for performing functional interaction corresponding to content of the test. In some specific embodiments, the first area 2081 is configured to perform probe testing. The second area 2082 is configured to lead out the bonding wire.

Referring to FIG. 2A, the first area 2081 and the second area 2082 are arranged continuously, that is, no partition wall is provided between the first area 2081 and the second area 2082. Compared with the related art, referring to FIG. 1, a partition wall 107 is provided between the first type of pad 105 and the second type of pad 106. In an embodiment of the present disclosure, on a premise of ensuring that the area for testing and the area for performing the functional interaction corresponding to content of the test are physically distinguished, it is possible to avoid a damage caused by the partition wall to the probe card when the probe is not aimed during performing the test, thereby prolonging a service life of the probe card. At the same time, reducing generation of impurities is conducive to improving accuracy of the test. In addition, the damage of the probe card to the partition wall is reduced, thereby improving the reliability of the packaging structure as a whole.

It is to be noted that, the first type of pad 105 in the related art corresponds to the first area 2081 in the embodiment of the disclosure, and both may have same function and area. The second type of pad 106 corresponds to the second area 2082 in the embodiment of the disclosure, and both may have same function and area. The area of the first area 2081 and the area of the second area 2082 may be same or different. Preferably, the area of the first area 2081 is the same as the area of the second area 2082.

It is to be noted that in other embodiments, it may be supported exit that on the same windowing areas, firstly probe card sticking test of probe card is done, and then bonding wire packaging is performed in a packaging factory, without affecting a yield of the packaging wire bond. In other words, the exposed part of the redistribution layer may also include only the second pad. The second pad can be configured both to perform probe test and to lead out the bonding wire.

Figure 2B:
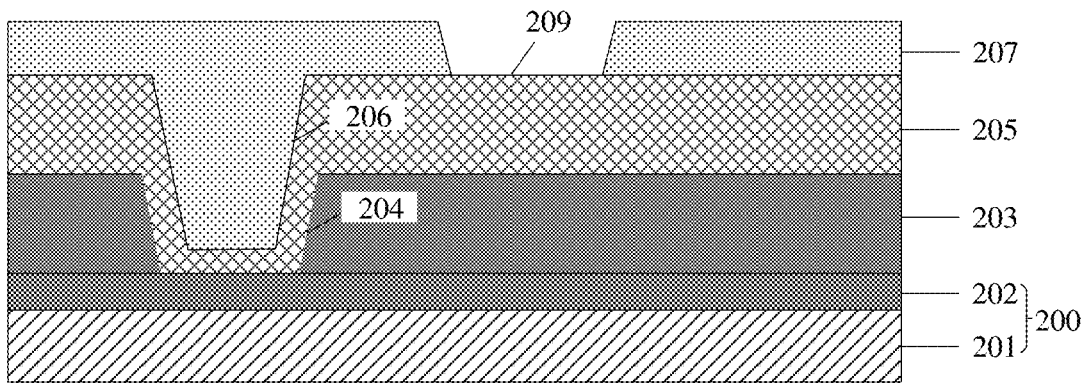
FIG. 2B is a schematic cross-sectional structural diagram of yet another package structure provided in an embodiment of the disclosure.

In some specific embodiments, referring to FIG. 2B, the package structure further includes multiple second pads 209. The second pads 209 are constituted by part of the redistribution layer 205 exposed by the insulating layer, and is configured for performing the test or for performing the functional interaction corresponding to the content of the test. At least part of the multiple second pads 209 in the multiple second pads 209 are arranged side by side with the at least one first pad 208 along a first direction. The first direction is perpendicular to a direction in which the first area points to the second area. The area of each of the first pads is larger than the area of each of the second pads.

The first direction may be X-axis direction or Y-axis direction. The second direction may be Y-axis direction or X-axis direction. It is to be noted that, when the first direction is X-axis direction, the second direction is Y-axis direction; when the first direction is Y-axis direction, the second direction is X-axis direction. For the sake of clear understanding, in the embodiments of the disclosure, it is taken as an example for explanation that the first direction is X-axis direction, and the second direction is Y-axis direction.

In practical application, the multiple second pads 209 and at least one first pad 208 may be formed in the same process.

In the embodiment, in order to ensure quality of testing and wire bonding, the partition wall between the first type of pad and the second type of pad in the related art is removed, so that the area of the first pad 208 is greater than or equal to the sum of the areas of the first type of pad and the second type of pad, which results in that the machine may not be able to accurately position the first pad 208 by recognizing its edge, while in the related art, the areas of the first type of pad and second type of pad are a maximum area that the machine can position the pads by recognizing their edges.

For example, in the related art, high-precision positioning is needed for testing and wire bonding. When the probe identifies a pad, an identification range of graphics is limited. The identification range of the test machine is 50 um from a center point to a surrounding. In this range, it is necessary to find surrounding edges of the window, that is, the edges of the pad. The first pad in an embodiment of the disclosure may be strip-shaped, and a length of at least one side is easy to exceed the identification range due to superposition of lengths of two pads (the first type of pad and the second type of pad) in the related art, so that edges of the first pad may not be found by the test machine in the existing identification accuracy range, and then a positioning failure of the first pad is caused.

In order to be able to accurately position the specific position of the first pad 208 within the existing identification accuracy range, in some embodiments of the disclosure, the package structure includes at least one first pad and multiple second pads, and by rationally arranging positions of the first pad and the multiple second pads, both areas of the first pad can be successfully positioned.

In some embodiments, the first pad and the second pad are both strip-shaped. The width of the first pad along the first direction is the same as the width of the second pad along the first direction. Spacing between two adjacent ones of the pads is equal. All pads arranged side by side along the first direction are flush at one end.

The strip shape includes a general rectangle (different in length and width) and a square (same in length and width). In some embodiments, each first pad 208 and each second pad 209 are both generally rectangular. In other embodiments, each second pad 209 has a square shape and each first pad 208 has a generally rectangular shape.

The width of each first pad 208 along the first direction is the same as the width of each second pad 209 along the first direction. The length of each first pad 208 along the second direction is greater than the length of each second pad 209 along the second direction.

In the above embodiment, spacing between two adjacent ones of the pads is equal, which can be understood as following. That is, the spacing between two adjacent first pads, the spacing between a first pad and a second pad adjacent with each other, and the spacing between two adjacent second pads are all equal. All the pads arranged side by side along the first direction being flush at one end, which can be understood as all the first pads and all the second pads arranged side by side along the first direction being flush at one end. For example, all the first pads and all the second pads arranged side by side along the first direction are flush at one end near an edge of the semiconductor functional structure.

In some embodiments, the number of the first pads are multiple, and at least part of the multiple first pads are arranged side by side along the first direction at a position near a first edge of the semiconductor functional structure. At least part of the multiple second pads are arranged side by side along the first direction on both sides of the multiple first pads.

Figure 3A:
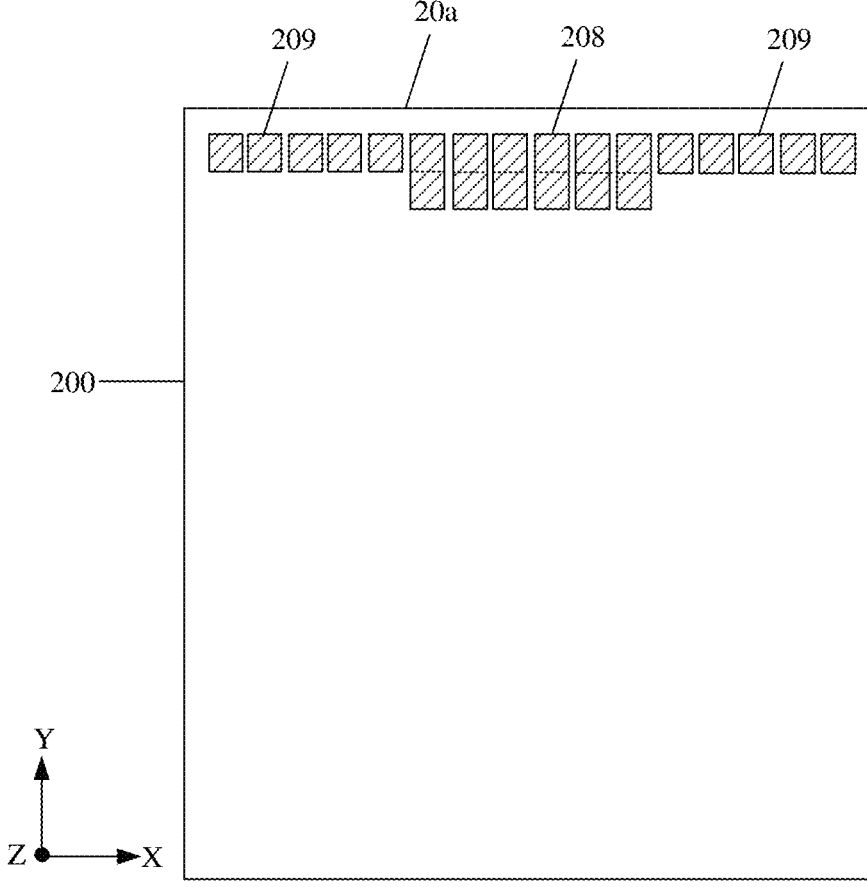
FIGS. 3A-3E are schematic diagrams of several relative position relationships of first pads and second pads provided by an embodiment of the disclosure.

With reference to FIG. 3A, the number of the first pads 208 may be multiple, and the multiple first pads are disposed at a middle position near the first edge of the semiconductor functional structure. The number of the second pads 209 may be multiple, and the multiple second pads 209 are respectively disposed on both sides of the multiple first pads 208.

Identification of the two areas of the first pads 208 may be assisted by the second pads 209 located on both sides.

Specifically, as mentioned above, the area of the second pad 209 is similar to that of the first type of pad or the second type of pad in the related art, and the second pad 209 is within the identification range of the test machine and the test machine can accurately identify the position (four edges) of each of the second pads 209. On the premise that the first pad 208 and the second pad 209 are both strip-shaped, the same in width, flush at one end, and spacing between two adjacent ones of the pads is equal, by reference to the positions of the second pads 209 on both sides, a predicted position of the area near the aligned end (first area or second area) in each of the first pads 208 can be obtained. Since in the width direction (that is, the first direction), the first pad 208 is within the identification range of the test machine, the area of each first pad 208 near the aligned end can be accurately identified in combination with the identification in the width direction. Upon accurate identification of one area of the first pad 208, a center point of the first area can be obtained. Considering that the two areas of the first pad are arranged continuously and share a long side, and a length of the long side of the first pad is constant, the center point of the first area is moved by a fixed distance to a second direction perpendicular to the first direction and then may be considered to be the center point of the other area of the first pad 208 away from the aligned end, thereby further identifying the other area of the first pad 208 away from the aligned end.

In some embodiments, all pads arranged side by side along the first direction are flush at one end near the edge of the semiconductor functional structure. The first area is located at one end near the edge of the semiconductor functional structure in both ends of the first pad, and the second area of the first pad is located at one end away from the edge of the semiconductor functional structure in both ends of the first pad. That is, the first area 2081 of the first pad can be identified by the second pads 209 located on both sides and then the second area 2082 can be identified by the first area 2081.

It is to be noted that, when a positional relationship of different areas in the first pad or a positional relationship between the first pad and the second pad is described by using the edge of the semiconductor functional structure, the edge refers to an edge to which the first pads are close among multiple edges of the semiconductor functional structure, and more specifically, an edge where to which first pads are close among two edges which are opposite along the second direction. Accordingly, subsequently, when a positional relationship of different areas in the second pad or a positional relationship of the first pad and the second pad is described by using an edge of the semiconductor functional structure, the edge refers to an edge to which the second pads are close among multiple edges of the semiconductor functional structure.

It is to be understood that, the process for leading out the bonding wire on the first pad 208 is flexible in controllability or adjustability. However, the process of aligning the first pad 208 with the probe card is relatively difficult. Therefore, the first area 2081 is arranged at the end near the edge of the semiconductor functional structure in both ends of the first pad 208, which is beneficial to reduce alignment difficulty between the first area 2081 and the probe card, and reserve a higher error rate for the probe card during the test.

In other embodiments, all the pads arranged side by side along the first direction are flush at one end away from the edge of the semiconductor functional structure. The second area is located in one end of the first pad near the edge of the semiconductor functional structure, and the first area is located in one end of the first pad away from the edge of the semiconductor functional structure. In this case, the first area 2081 of the first pad can also be identified by the second pads 209 located on both sides, and then the second area 2082 can be identified by the first area 2081.

The second area 2082 is provided at one end near the edge of the semiconductor functional structure in the two ends of the first pad 208, which is beneficial to shorten the length of the bonding wire welded to the second area 2082 and increase bonding process window.

In some embodiments, at least two of the second pads are provided on each side of the multiple first pads.

The multiple first pads 208 have a first side and a second side. The first side of the first pads 208 and the second side of the first pads 208 are opposite two sides. A direction from the first side to the second side is parallel to the X-axis direction.

For example, referring to FIG. 3A, the number of the first pads 208 is six, and the number of the second pads 209 is ten. Six of the first pads 208 and ten of the second pads 209 are arranged side by side in the X-axis direction near the first edge 20a of the semiconductor functional structure 200. Ten of the second pads 209 are provided on the first side and the second side of the six of the first pads 208.

It is to be noted that, the number of second pads 209 located on two sides of the first pad 208 respectively may be one or more. When one second pad 209 is respectively provided on the two sides of the first pad 208, it can help realize the identification of the first area and the second area in the first pad 208. However, in an actual process operation, the second pads 209 located at an edge away from a side of the first pad 208 in both sides are prone to damage such as being cut, worn or the like. Therefore, two or more of the second pads 209 are provided on both sides of the first pad 208. As such, even if one of the second pads 209 at the edge is damaged, it is possible to ensure that the first pad is accurately positioned by the remaining undamaged second pads 209.

Figure 3B:
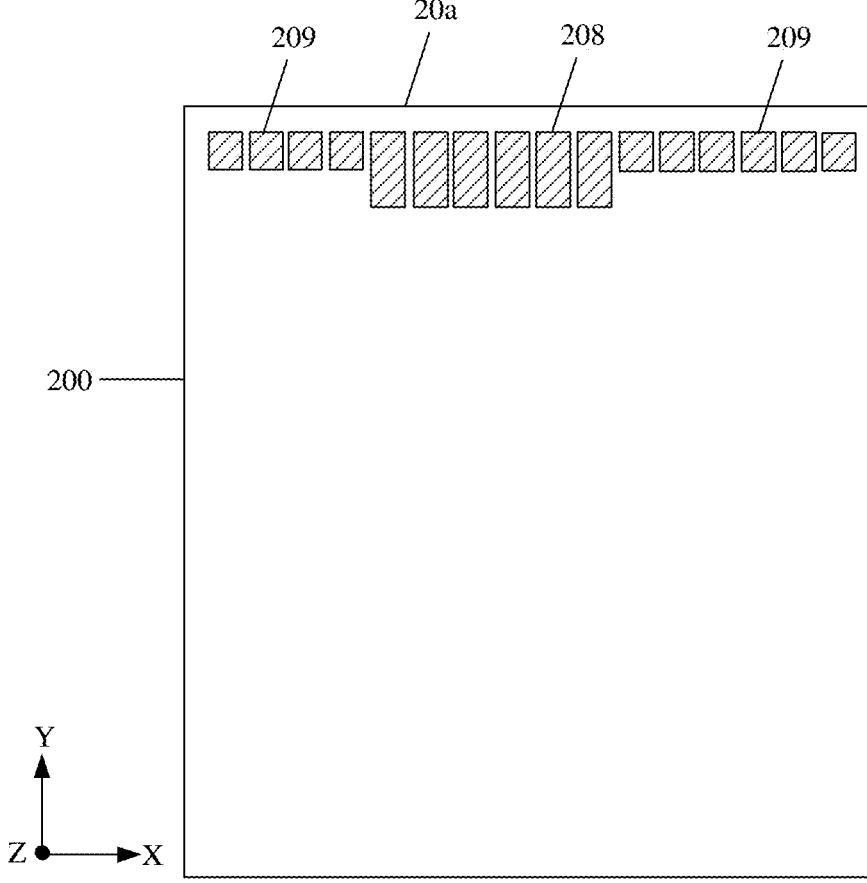

Here, a first number of the second pads are provided on a first side of the multiple first pads 208, and a second number of the second pads are provided on a second side of the multiple first pads. The first number and the second number may be the same or different. FIG. 3A shows a case where the first number is the same as the second number, and FIG. 3B shows a case where the first number is different from the second number. In addition, it is to be noted that, when the first number and the second number are different, the first pads may also be located in a middle area along the first direction, that is, a distance between the leftmost side of the multiple first pads and the left edge of the semiconductor functional structure is equal to a distance between the rightmost side of the multiple first pads and the right edge of the semiconductor functional structure.

In other embodiments, a part of the second pads are arranged side by side along the first direction on both sides of the multiple first pads, and the other part of the second pads in the multiple second pads are arranged side by side along the second direction at a position close to a second edge of the semiconductor functional structure. The second direction is perpendicular to the first direction. The first edge and the second edge are two opposite edges of the semiconductor functional structure.

Figure 3C:
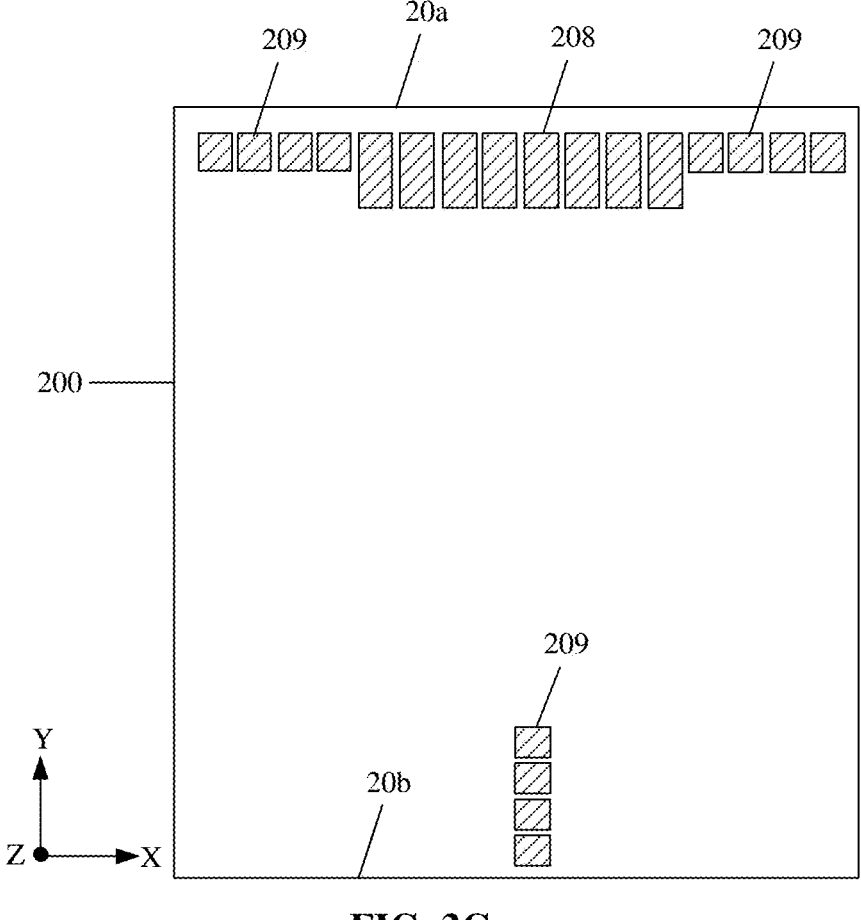

For example, referring to FIG. 3C, eight first pads 208 and twelve second pads 209 are provided on the semiconductor functional structure 200. The eight first pads 208 are provided near the first edge 20*a* of the semiconductor functional structure, and four of the second pads 209 are respectively provided on both sides of the eight first pads 208 (a total of eight second pads). Four of the second pads are provided near the second edge 20*b* of the semiconductor functional structure, and are arranged side by side along the Y axis direction.

It can be seen that, compared with the previous embodiment, the multiple second pads 209 arranged along the second direction (along the Y-axis direction) near the second edge 20*b* of the semiconductor functional structure are added in FIG. 3C based on FIG. 3A.

It is to be understood that, areas of the multiple second pads 209 arranged side by side in the Y-axis direction are within the identification range of the test machine. The test machine can accurately identify the position of each second pad 209 (four edges). Based on this, an accurate second direction can be obtained by using the multiple second pads 209 arranged side by side along the Y-axis direction, and thus a more accurate movement along the second direction is realized when the second areas are identified by the identified first areas moving a fixed distance along the second direction, thereby realizing more accurate positioning of the second area.

It is to be noted that, the multiple second pads 209 arranged along the second direction shown in FIG. 3C are rotated clockwise by 90 degrees compared to the multiple second pads 209 arranged along the first direction. However, in other embodiments, the multiple second pads 209 arranged along the second direction may have the totally same placement direction with the multiple second pads 209 arranged along the first direction, and are not rotated by 90 degrees. It is to be understood that the 90-degree rotation is more conducive to saving the areas for placing the pads.

In some embodiments, the number of the first pads is multiple, a part of the first pads are disposed side by side along the first direction near the first edge of the semiconductor functional structure, and the other part of the first pads disposed side by side along the first direction near the second edge of the semiconductor functional structure. A part of the second pads are arranged side by side along the first direction on both sides of a part of the first pads, and the other part of the second pads are arranged side by side along the first direction on both sides of the other part of the first pads. The first edge and the second edge are two opposite edges of the semiconductor functional structure.

Figure 3D:
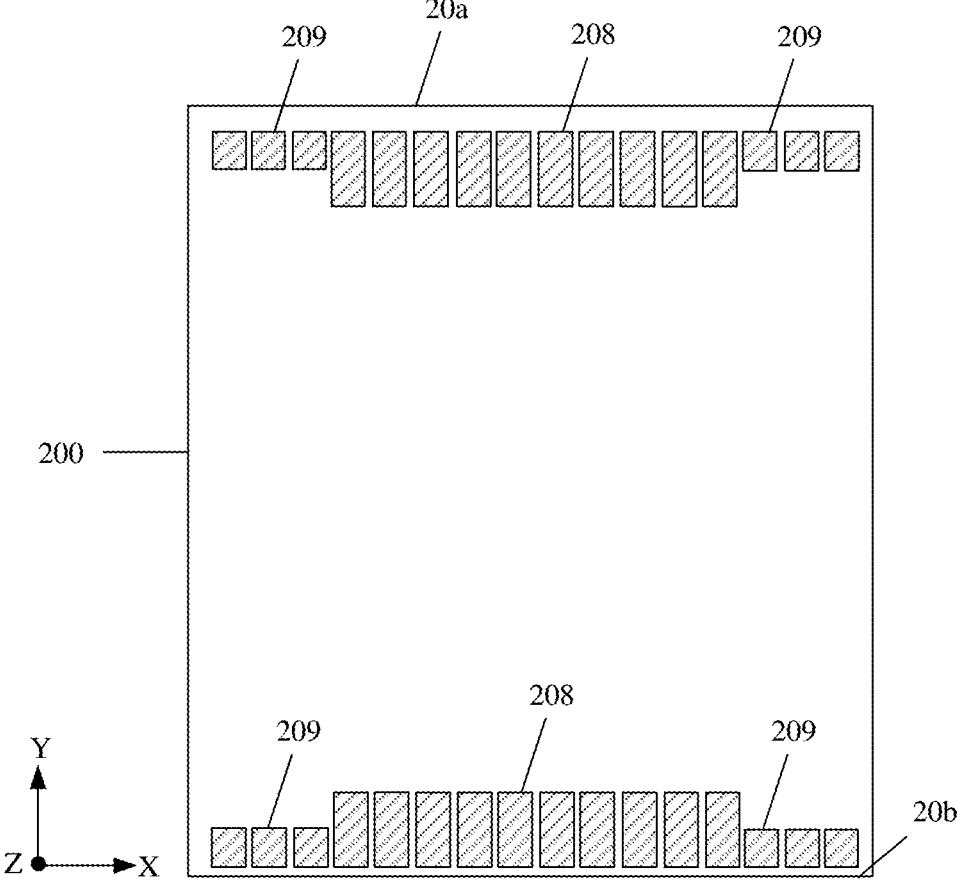

For example, referring to FIG. 3D, twenty first pads 208 and twelve second pads 209 are provided on the semiconductor functional structure 200. Ten of the first pads 208 are provided near the first edge 20*a* of the semiconductor functional structure, and three of the second pads 209 are respectively provided on both sides of the ten first pads 208 (a total six of the second pads). At a position close to the second edge 20*b* of the semiconductor functional structure, ten of the first pads 208 are likewise provided, and three of the second pads 209 are respectively provided on both sides of the 10 first pads 208 (a total six of the second pads).

In some embodiments, an arrangement of the first pads and second pads located near the first edge of the semiconductor functional structure is symmetrical with an arrangement of the first and second pads located near the second edge of the semiconductor functional structure. The symmetry can be understood to mean that the pads located near the first edge are mirrored along the first direction with respect to the pads located near the second edge.

For example, referring to FIG. 3D, ten of the first pads 208 and six of the second pads 209 at the position near the first edge 20*a* of the semiconductor functional structure are arranged side by side in the X-axis direction. Ten of the first pads 208 and six of the second pads 209 at the position near the second edge 20*b* of the semiconductor functional structure are arranged side by side in the X-axis direction. All of the pads at the position near the first edge 20*a* and all of the pads at the position near the second edge 20*b* are arranged in a symmetrical configuration, so that the process flow can be saved and the production efficiency can be improved.

When the pads at the position near the first edge is symmetrically arranged with the pads at the position near the second edge, the first area and the second area of the corresponding first pad 208 can be identified from the first edge and the second edge respectively. When the two first pads corresponding to the first edge and the second edge are identified and a connecting direction of the two corresponding first areas is parallel to the second direction, it is further indicated that the identification of both sides is accurate.

In other embodiments, the arrangement of the first pads and the second pads located near the first edge of the semiconductor functional structure is asymmetrical with the arrangement of the first pads and the second pads located near the second edge of the semiconductor functional structure. The asymmetry can be understood to mean that the pads at the position near the first edge are not mirrored along the first direction with respect to the pads at the position near the second edge.

Figure 3E:
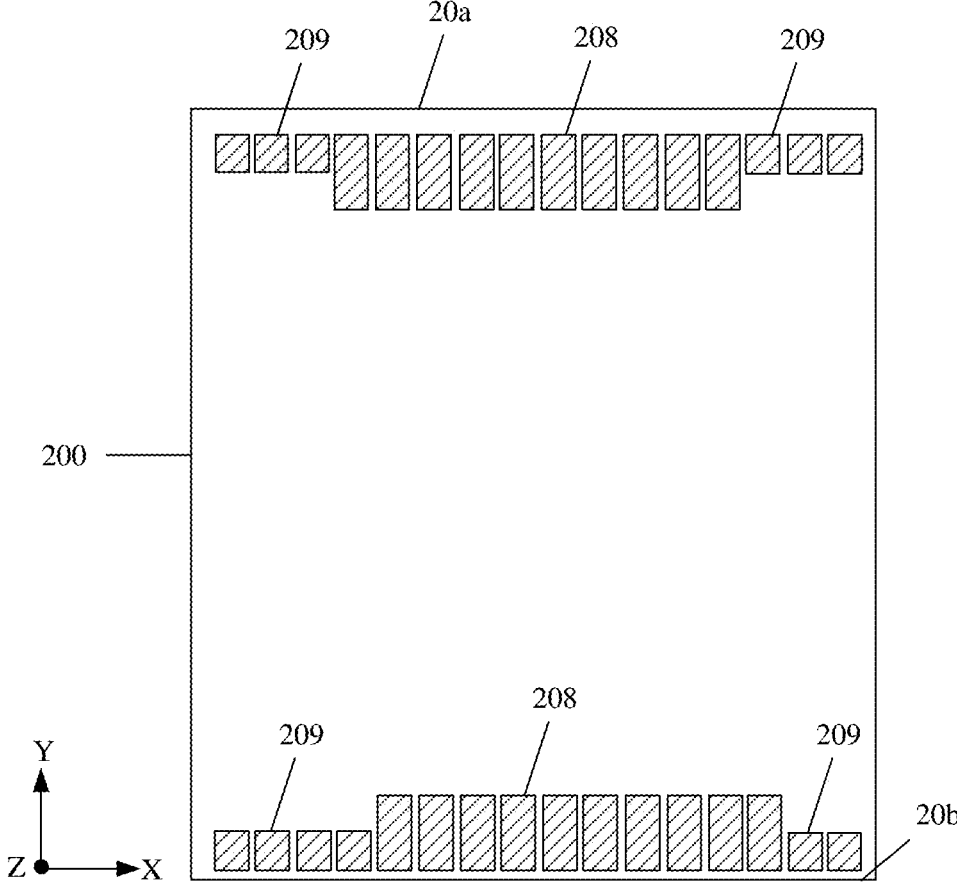

For example, referring to FIG. 3E, all of the pads located near the first edge 20*a* and all of the pads located at the second edge 20*b* are arranged in an asymmetric configuration. Specifically, ten first pads are provided near the first edge 20*a* of the semiconductor functional structure, and three second pads 209 are respectively provided on the first side and the second side of the ten first pads. Ten first pads are provided near the second edge 20*b* of the semiconductor functional structure, and four second pads 209 are provided on the first side of the ten first pads, and two second pads 209 are provided on the second side of the ten first pads. As such, all of the pads located at the position near the first edge 20*a* and all of the pads located at the position near the second edge 20*b* are arranged in an asymmetric configuration.

When the pads at the position located near the first edge and the pads at the position located near the second edge are arranged asymmetrically, whether an error may occur in the identification result can be judged by identifying the first area 2081 and the second area 2082 of the corresponding first pad 208 from the first edge and the second edge, respectively. For example, cases in which the first area 2081 and the second area 2082 of the corresponding first pad 208 are respectively identified from the first edge and the second edge should be different. When the detected cases of the first pads of the edges at this time are the same, it can be judged that at least one of the identification cases of the two edges is wrong.

It is to be noted that the descriptions in FIGS. 3A, 3B, 3C, 3D, and 3E about the numbers of first pads, second pads (for example, 4, 6, 8, 10, 20, and the like) are only for schematic illustration of the disclosure, but not intended to limit the scope of the disclosure.

According to another aspect of the disclosure, there is provided a semiconductor device, and the semiconductor device includes a semiconductor functional structure and a package structure as described in the above-mentioned multiple embodiments of the disclosure.

Figure 4:
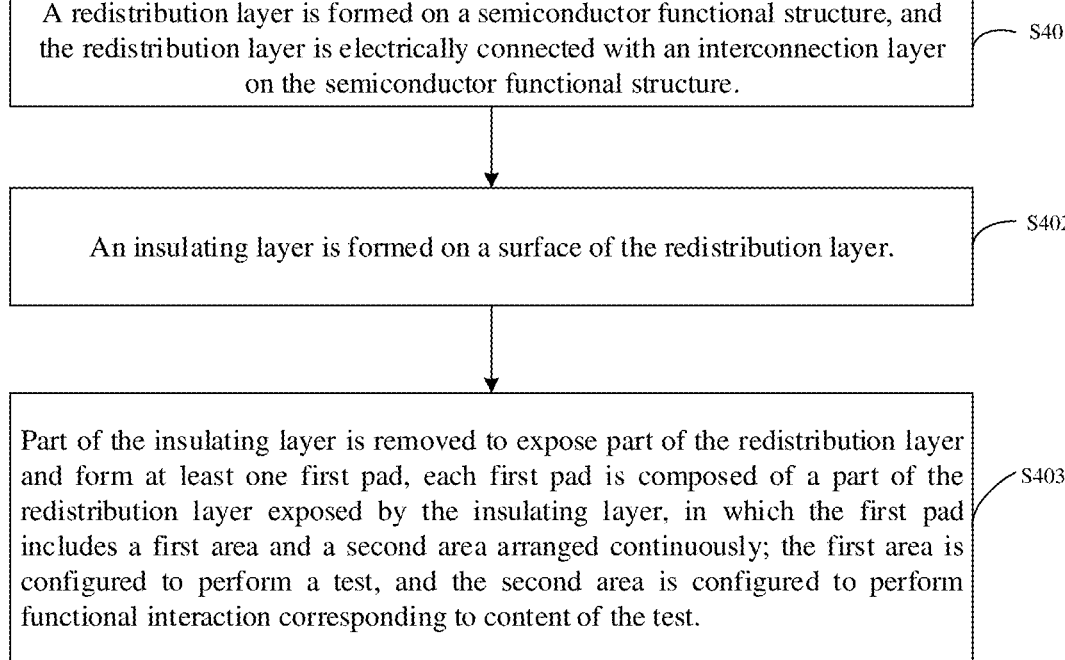
FIG. 4 is a flowchart of a method for manufacturing a package structure provided in an embodiment of the disclosure.

According to yet another aspect of the disclosure, the embodiments of the disclosure provide a method for manufacturing a package structure for forming the package structure in the above-mentioned embodiments. FIG. 4 is a flowchart of the method for manufacturing the package structure provided by the embodiments of the disclosure. As shown in FIG. 4, the method for manufacturing the package structure provided by the embodiments of the disclosure includes the following operations.

In S401, a redistribution layer is formed on a semiconductor functional structure, and the redistribution layer is electrically connected with an interconnection layer on the semiconductor functional structure.

In S402, an insulating layer is formed on a surface of the redistribution layer.

In S403, part of the insulating layer is removed to expose part of the redistribution layer and form at least one first pad. Each first pad is composed of a part of the redistribution layer exposed by the insulating layer.

The first pad includes a first area and a second area arranged continuously. The first area is configured to perform a test, and the second area is configured to perform functional interaction corresponding to content of the test.

Figure 5A:
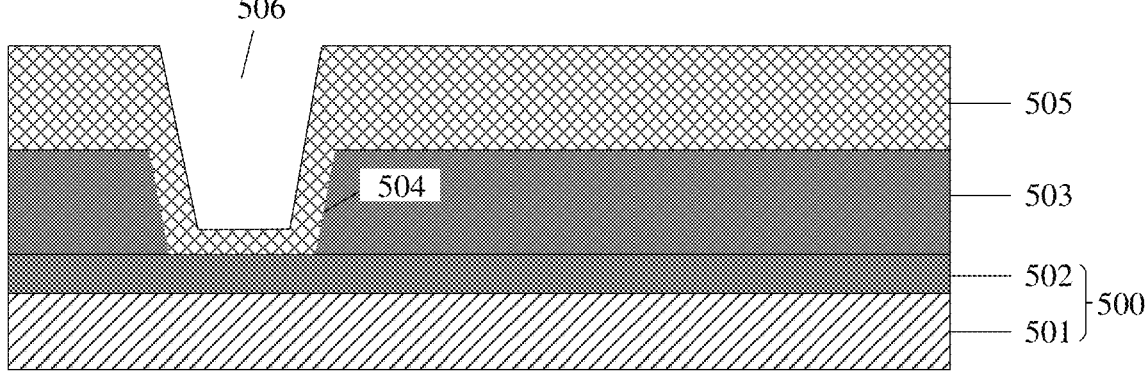
FIGS. 5A-5C are schematic cross-sectional diagrams of a package structure during a manufacturing process provided in an embodiment of the disclosure.
Figure 5B:
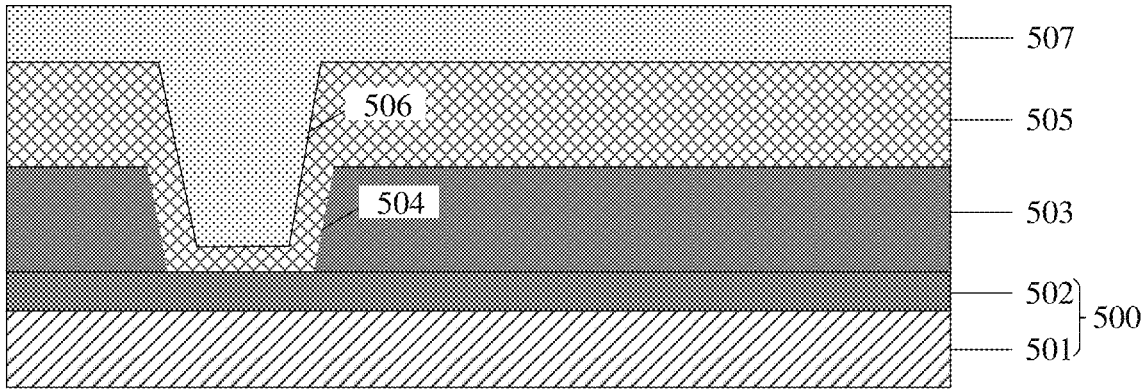
Figure 5C:
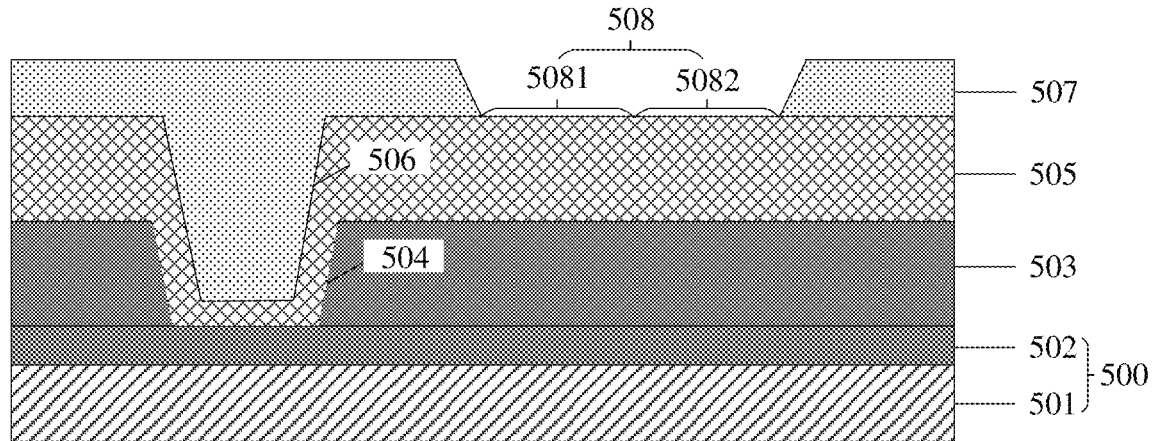

It is to be understood that the operations shown in FIG. 4 are not exclusive and that other operations may be performed before, after, or between any of the operations shown. The sequence of the operations shown in FIG. 4 can be adjusted according to actual needs. FIGS. 5A to 5C are schematic cross-sectional diagrams of a manufacturing process of a package structure provided by an embodiment of the disclosure. The method for manufacturing the package structure provided by the embodiment of the disclosure will be described in detail with reference to FIGS. 4 and 5A to 5C.

In S401, a redistribution layer is formed.

Referring to FIG. 5A, the formation of the redistribution layer includes the following operations. A substrate is provided (not shown in FIG. 5A). A semiconductor functional structure 500 is formed on the substrate. The redistribution layer 505 is formed on the semiconductor functional structure 500. The formation of the semiconductor functional structure on the substrate includes forming a semiconductor functional layer 501 on the substrate and forming the interconnection layer 502 on the semiconductor functional layer 501.

The interconnection layer 502 may be formed on the semiconductor functional layer 501 by physical vapor deposition (PVD), chemical vapor deposition (CVD), atomic layer deposition (ALD), or the like.

Next, the isolation layer 503 is formed on the interconnection layer. The isolation layer 503 is configured for protecting the interconnection layer 502 from being damaged. The component material of the isolation layer 503 includes but is not limited to tetraethyl orthosilicate (TEOS). The method for forming the isolation layer 503 includes but is not limited to PVD, CVD, ALD and other processes.

Here, part of areas of the isolation layer 503 are removed, so that multiple vias 504 are provided in the isolation layer 503, and the vias 504 expose part of the interconnection layer 502. The exposed part of the interconnection layer 502 serves as the area where the redistribution layer 505 is electrically connected to the interconnection layer 502. The shape of the vias 504 may be cylindrical, inverted trapezoidal, or of any suitable shape.

Next the redistribution layer 505 is formed on the surface of the isolation layer 503 and in the vias 504, in which the redistribution layer 505 is electrically connected to the interconnection layer 502.

In some specific embodiments, a specific method for forming the redistribution layer 505 on the isolation layer 503 includes the following operations. A new wire pattern is formed on the isolation layer 503 by exposure and development. Then the redistribution layer 505 is formed according to the new wire pattern by electroplating technique. The redistribution layer 505 includes new wire paths connected to the interconnection layer 502 electrically. A component material of the redistribution layer 505 includes but is not limited to metal. Preferably, the material of the redistribution layer is aluminum (Al).

It is to be noted that the thickness of the redistribution layer on the exposed part of the interconnection layer 502 and the thickness of the redistribution layer on the surface of the isolation layer 503 may be the same. In some embodiments, the diameter width of the vias 504 is larger than twice the thickness of the redistribution layer. In the case, the redistribution layer 505 covers the sidewalls and the bottoms of the vias 504, and the redistribution layer 505 defines grooves 506.

In S402, referring to FIG. 5B, the insulating layer 507 is formed on the surface of the redistribution layer 505.

The insulating layer 507 covers the surface of the redistribution layer 505. On one hand, the insulating layer can be used for isolating electrical connections between the redistribution layer 505 and other conductive materials, and on the other hand, it can be used for protecting the redistribution layer 505 from being damaged. The material of the insulating layer 507 includes but is not limited to polyimide (PI). The method for forming the insulating layer 507 includes but is not limited to PVD, CVD, ALD and other processes.

The insulating layer 507 is also filled in the grooves 506 defined by the redistribution layer 505.

In some embodiments, the hardness of the material of the insulating layer 507 is less than the hardness of the material of the redistribution layer 505, which can reduce the stress of the package structure and increase the reliability. In S403, referring to FIG. 5C, at least one first pad 508 is formed.

Specifically, part of the insulating layer 507 is removed to expose part of the redistribution layer 505. The exposed part of the redistribution layer 505 includes the first pad 508. Each first pad 508 includes a first area 5081 and a second area 5082 arranged continuously. The first area 5081 is configured for performing the test, and the second area 5082 is configured for performing the functional interaction corresponding to the content of the test.

Based on this, in various embodiments of the disclosure, at least one first pad is provided on the semiconductor functional structure. Each first pad includes a first area for performing the test and a second area for performing the functional interaction corresponding to the content of the test. The first area and the second area are arranged continuously, in other words, no partition wall is provided between the first area and the second area. By doing so, on a premise of ensuring that the area for testing and the area for performing the functional interaction corresponding to content of the test are physically distinguished, it is possible to avoid the damage caused by the partition wall to the probe card when the probe is not aimed during performing the test, thereby prolonging a service life of the probe card. At the same time, generation of impurities is reduced, which is conducive to improving accuracy of the test. In addition, the damage of the probe card to the partition wall is reduced, thereby improving the reliability of the packaging structure as a whole.

In the embodiments provided by the disclosure, it is to be understood that the disclosed apparatus and methods may be implemented in a non-target manner. The embodiments of the device described above are only schematic. For example, a division of the unit is only a logical function division, and there can be another division manner in actual implementation, for example, multiple units or parts may be combined, or be integrated into another system, or some features can be ignored or not implemented. In addition, the parts shown or discussed are coupled with each other, or directly coupled.

The units described above as separate elements may or may not be physically separated. The elements displayed as units may or may not be physical units, that is, may be located in one place or may be distributed over multiple network units. According to actual needs, some or all of the units can be selected to achieve a purpose of the solution of the embodiments.

The features disclosed in the embodiments of several methods or devices provided by the disclosure can be arbitrarily combined without conflict, in order to obtain a new embodiment of a method or embodiment of a device.

What are said above are only the specific embodiments of the disclosure, but the scope of protection of the disclosure is not limited thereto. Within the technical scope of the disclosure, any skilled person familiar with the technical field may easily conceive changes or substitutions, which should be covered within the scope of protection of the disclosure. Therefore, the scope of protection of the disclosure should be subject to the scope of protection of the claims.

INDUSTRIAL PRACTICALITY

In the various embodiments of the disclosure, at least one first pad is provided on the semiconductor functional structure. Each first pad includes a first area for performing the test and a second area for performing the functional interaction corresponding to content of the test. The first area and the second area are arranged continuously, in other words, no partition wall is provided between the first area and the second area. By doing so, on a premise of ensuring that the area for testing and the area for performing the functional interaction corresponding to content of the test are physically distinguished, it is possible to avoid the damage caused by the partition wall to the probe card when the probe is not aimed during performing the test, thereby prolonging a service life of the probe card. At the same time, generation of impurities is reduced, which is conducive to improving accuracy of the test. In addition, the damage of the probe card to the partition wall is reduced, thereby improving the reliability of the packaging structure as a whole.

The invention claimed is:

1. A package structure, comprising:
a redistribution layer electrically connected with an interconnection layer of a semiconductor functional structure; and
an insulating layer covering the redistribution layer and exposing part of the redistribution layer;
wherein the exposed part of the redistribution layer comprises at least one first pad, the first pad comprises a first area and a second area arranged continuously, the first area is configured to perform a probe card sticking test, and the second area is configured for leading out bonding wires on the first pad;
further comprising: a plurality of second pads, which are composed of part of the redistribution layer exposed by the insulating layer and are configured to perform the test or performing the functional interaction corresponding to the content of the test,
wherein at least part of the plurality of the second pads and the at least one first pad are arranged side by side along a first direction, the first direction is perpendicular to a direction from the first area to the second area, and an area of each first pad is larger than an area of each of the second pads;
wherein the first pad and the second pads both have a strip shape, a width of the first pad along the first direction is same as a width of the second pads along the first direction, spacing distances between any two adjacent pads are equal, and all pads arranged side by side along the first direction are flush at one end;
wherein a number of the at least one first pad is multiple, at least part of the first pads are arranged side by side along the first direction near a first edge of the semiconductor functional structure, and at least part of the second pads are arranged side by side along the first direction on both sides of the at least part of the first pads;
wherein a first number of the second pads are provided on a first side of the at least part of the first pads, a second number of the second pads are provided on a second side of the at least part of the first pads, and the first number is different from the second number.

2. The package structure according to claim 1, wherein at least two of the second pads are provided on each side of the at least part of the first pads.

3. The package structure according to claim 1, wherein part of the second pads are arranged side by side along the first direction on both sides of the at least part of the first pad, and another part of the second pads are arranged side by side along a second direction near a second edge of the semiconductor functional structure, the second direction is perpendicular to the first direction, and the first edge and the second edge are two opposite edges of the semiconductor functional structure.

4. The package structure according to claim 1, wherein a number of at least one the first pad is multiple, part of the first pads are arranged side by side along the first direction near a first edge of the semiconductor functional structure, and another part of the first pads are arranged side by side along the first direction near a second edge of the semiconductor functional structure, part of the second pads are arranged side by side along the first direction on both sides of the part of the first pads, and another part of the second pads are arranged side by side along the first direction on both sides of the another part of the first pads, and the first edge and the second edge are two opposite edges of the semiconductor functional structure.

5. The package structure according to claim 4, wherein an arrangement of the first pads and the second pads near the first edge of the semiconductor functional structure is symmetrical with an arrangement of the first pads and the second pads near the second edge of the semiconductor functional structure.

6. The package structure according to claim 1, wherein all of the pads arranged side by side along the first direction are flush at one end near an edge of the semiconductor functional structure;

the first area is located at an end of each first pad near the edge of the semiconductor functional structure, and the second area is located at an end of each of the first pads away from the edge of the semiconductor functional structure.

7. A semiconductor device, comprising a semiconductor functional structure and a package structure according to claim 1.

8. A semiconductor device, comprising a semiconductor functional structure and a package structure according to claim 2.

9. A semiconductor device, comprising a semiconductor functional structure and a package structure according to claim 3.

10. A semiconductor device, comprising a semiconductor functional structure and a package structure according to claim 4.

11. A semiconductor device, comprising a semiconductor functional structure and a package structure according to claim 5.

12. A package structure, comprising:

a redistribution layer electrically connected with an interconnection layer of a semiconductor functional structure; and an insulating layer covering the redistribution layer and exposing part of the redistribution layer;

wherein the exposed part of the redistribution layer comprises at least one first pad, the first pad comprises a first area and a second area arranged continuously, the first area is configured to perform a probe card sticking test, and the second area is configured for leading out bonding wires on the first pad;

further comprising: a plurality of second pads, which are composed of part of the redistribution layer exposed by the insulating layer and are configured to perform the test or performing the functional interaction corresponding to the content of the test, wherein at least part of the plurality of the second pads and the at least one first pad are arranged side by side along a first direction, the first direction is perpendicular to a direction from the first area to the second area, and an area of each first pad is larger than an area of each of the second pads;

wherein the first pad and the second pads both have a strip shape, a width of the first pad along the first direction is same as a width of the second pads along the first direction, spacing distances between any two adjacent pads are equal, and all pads arranged side by side along the first direction are flush at one end;

wherein a number of the at least one first pad is multiple, at least part of the first pads are arranged side by side along the first direction near a first edge of the semiconductor functional structure, and at least part of the second pads are arranged side by side along the first direction on both sides of the at least part of the first pads;

wherein part of the second pads are arranged side by side along the first direction on both sides of the at least part of the first pad, and another part of the second pads are arranged side by side along a second direction near a second edge of the semiconductor functional structure, the second direction is perpendicular to the first direction, and the first edge and the second edge are two opposite edges of the semiconductor functional structure.

13. A package structure, comprising:

a redistribution layer electrically connected with an interconnection layer of a semiconductor functional structure; and an insulating layer covering the redistribution layer and exposing part of the redistribution layer;

wherein the exposed part of the redistribution layer comprises at least one first pad, the first pad comprises a first area and a second area arranged continuously, the first area is configured to perform a probe card sticking test, and the second area is configured for leading out bonding wires on the first pad;

further comprising: a plurality of second pads, which are composed of part of the redistribution layer exposed by the insulating layer and are configured to perform the test or performing the functional interaction corresponding to the content of the test, wherein at least part of the plurality of the second pads and the at least one first pad are arranged side by side along a first direction, the first direction is perpendicular to a direction from the first area to the second area, and an area of each first pad is larger than an area of each of the second pads;

wherein the first pad and the second pads both have a strip shape, a width of the first pad along the first direction is same as a width of the second pads along the first direction, spacing distances between any two adjacent pads are equal, and all pads arranged side by side along the first direction are flush at one end;

wherein a number of at least one the first pad is multiple, part of the first pads are arranged side by side along the first direction near a first edge of the semiconductor functional structure, and another part of the first pads are arranged side by side along the first direction near a second edge of the semiconductor functional structure, part of the second pads are arranged side by side along the first direction on both sides of the part of the first pads, and another part of the second pads are arranged side by side along the first direction on both sides of the another part of the first pads, and the first edge and the second edge are two opposite edges of the semiconductor functional structure.

* * * * *